US012707664B2

(12) United States Patent
Krebs et al.

(10) Patent No.: US 12,707,664 B2
(45) Date of Patent: Aug. 11, 2026

(54) TRANSISTOR ARRANGEMENT AND METHOD FOR PRODUCING A TRANSISTOR WITH A FIN STRUCTURE

(71) Applicant: Robert Bosch GmbH, Stuttgart (DE)

(72) Inventors: Daniel Krebs, Aufhausen (DE); Jens Baringhaus, Sindelfingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 363 days.

(21) Appl. No.: 18/486,379

(22) Filed: Oct. 13, 2023

(65) Prior Publication Data

US 2024/0128358 A1 Apr. 18, 2024

(30) Foreign Application Priority Data

Oct. 14, 2022 (DE) ..................... 10 2022 210 842.6

(51) Int. Cl.
*H10D 30/01* (2025.01)
*H10D 30/62* (2025.01)

(52) U.S. Cl.
CPC ....... *H10D 30/024* (2025.01); *H10D 30/6211* (2025.01)

(58) Field of Classification Search
CPC ......................... H10D 33/024; H10D 30/6211
USPC .......................................................... 257/288
See application file for complete search history.

(56) References Cited

U.S. PATENT DOCUMENTS

2003/0178672 A1 9/2003 Hatakeyama et al.
2009/0057756 A1* 3/2009 Hshieh ................. H10D 30/668 257/E21.409
2019/0386095 A1 12/2019 Takeuchi et al.

FOREIGN PATENT DOCUMENTS

DE 112017007186 T5 12/2019
DE 102020215044 A1 6/2022

* cited by examiner

*Primary Examiner* — Phuc T Dang
(74) *Attorney, Agent, or Firm* — NORTON ROSE FULBRIGHT US LLP

(57) ABSTRACT

A transistor arrangement for power transistors with a fin structure. It is provided to lower the epitaxy layer of the transistor arrangements in an edge region surrounding the fin structure and to introduce shield implants and edge implants into the epitaxy layer after lowering.

9 Claims, 4 Drawing Sheets

TRANSISTOR ARRANGEMENT AND METHOD FOR PRODUCING A TRANSISTOR WITH A FIN STRUCTURE

FIELD

The present invention relates to a transistor arrangement and to methods for producing a transistor with a fin structure. The present invention furthermore relates to a power transistor with such a transistor arrangement.

BACKGROUND INFORMATION

In the field of power electronics, power transistors with a so-called fin structure are described in the related art. Such a fin structure can in particular be advantageous in order to provide as high a channel density as possible and to realize as low an on-resistance as possible.

For example, German Patent Application No. DE 10 2020 215 044 A1 describes a power transistor with a fin structure and a method for producing such a power transistor.

SUMMARY

The present invention provides a transistor arrangement, a power transistor, and methods for producing a transistor with a fin structure. Advantageous embodiments of the present invention are disclosed herein.

According to an example embodiment of the present invention, the following is provided:

Transistor arrangement comprising a semiconductor substrate and an epitaxy layer applied onto the semiconductor substrate. The epitaxy layer has a first side which faces the semiconductor substrate. A second side of the epitaxy layer is opposite the first side and thus faces away from the semiconductor substrate. The epitaxy layer comprises a region with a fin structure and an edge region surrounding the region with the fin structure. A thickness of the epitaxy layer between the first side and the second side in the region with the fin structure is greater than a thickness of the epitaxy layer between the first side and the second side in the edge region. In other words, the epitaxy layer in the edge region is lowered in comparison to the region with the fin structure.

According to an example embodiment of the present invention, the following is furthermore provided:

A power transistor comprising a transistor arrangement according to the present invention.

According to an example embodiment of the present invention, the following is provided:

Method for producing a transistor with a fin structure, comprising the following steps. A step of providing a semiconductor substrate and an epitaxy layer applied onto the semiconductor substrate. Here, the epitaxy layer has a first side facing the semiconductor substrate and a second side opposite the first side. Furthermore, the method comprises a step of introducing a trench in an edge region surrounding a region for the fin structure of the transistor. Furthermore, the method comprises a step of producing a fin structure in the epitaxy layer. Optionally, the introduction of the trench and the production of the fin structure in the epitaxy layer can occur in a common process step. Moreover, the method comprises a step of producing first shield implants in the region of the epitaxy layer, for the fin structure of the transistor, and a step of producing a further shield implant in the edge region of the epitaxy layer.

The present invention is based on the finding that, in the epitaxy layer of a transistor arrangement with a fin structure, so-called shield structures are generally required both below the fin structure and in an edge region surrounding the fin structure. These shield structures can be highly doped regions which are introduced into the epitaxy layer by implantation at a specified penetration depth. The implantations for the shielding in the edge region should achieve a depth as similar as possible to a region to be shielded in a cell field with the fin structure. This requires a relatively large implantation depth and associated high effort for an epitaxy layer with a flat surface.

According to the present invention, this finding is into account and a transistor arrangement in which the shield and edge implants can be realized as simply as possible and with less effort, in particular less implantation energy, is provided. According to an example embodiment of the present invention, it is provided for this purpose to lower the epitaxy layer in the edge region. This can take place, for example, by introducing corresponding trenches or the like. By such a lowering of the epitaxy layer in the edge region, the required depth of shield and edge implants in the lowered edge region can hence be achieved more easily and with less implantation energy.

The feature of the lowered edge regions around the regions with the fin structure can be applied to both FinFET and FinMOS transistors. Likewise, the present invention can be implemented with silicon carbide (SiC) as well as gallium nitride (GaN) or other wide-bandgap materials.

According to one example embodiment of the present invention, the thickness of the epitaxy layer in the region with the fin structure is greater, at least by a thickness of the fin structure, than the thickness of the epitaxy layer in the edge region. In other words, the epitaxy layer in the edge region is lowered, at least by the thickness of the fin structure, in comparison to the region with the fin structure. The implants can thus be realized in the lowered edge region for the desired penetration depth with correspondingly lower implantation energy.

According to one example embodiment of the present invention, the thickness of the epitaxy layer in the region with the fin structure is greater than the thickness of the epitaxy layer in the edge region by more than the thickness of the fin structure. In other words, the edge region is lowered by more than the thickness of the fin structure, i.e., a trench in this edge region is greater than the height of the fins for the fin structure. A particularly good field-shielding effect of the implants in the edge region can thereby be achieved with low implantation energies.

According to one example embodiment of the present invention, the epitaxy layer comprises a first shield implant arranged below the region with the fin structure. Furthermore, the epitaxy layer comprises a further shield implant arranged in the edge region. In this case, a lower end of the further shield implant facing the first side of the epitaxy layer projects at least as deep into the epitaxy layer as a lower end of the first shield implant facing the first side of the epitaxy layer.

According to one example embodiment of the present invention, the first shield implant and the further shield implant project at least approximately equally far into the epitaxy layer.

According to one example embodiment of the present invention, the epitaxy layer furthermore comprises an edge implant arranged in a region of the edge region facing away from the region with the fin structure. The shield implant in the edge region and the additional edge implant may overlap. The edge implant generally has a lower doping than the shield implant. Alternatively, the shield implant and the edge implant can, for example, also be spaced apart from one another and be realized at the same implantation depth.

According to one example embodiment of the present invention, first electrical contacting is provided on the second side of the epitaxy layer in the region of the fin structure. Furthermore, second electrical contacting is provided in the edge region. The first electrical contacting and the second electrical contacting can be electrically connected to one another here.

The above embodiments and developments can be arbitrarily combined with one another as far as is reasonable. Further embodiments, developments, and implementations of the present invention also include combinations not explicitly mentioned of features of the present invention described above or below with respect to the exemplary embodiments. A person skilled in the art will in particular also add individual aspects as improvements or additions to the respective basic forms of the present invention, in view of the disclosure herein.

BRIEF DESCRIPTION OF THE DRAWINGS

Further features and advantages of the present invention are explained hereinafter with reference to the figures.

DETAILED DESCRIPTION OF EXAMPLE EMBODIMENTS

Figure 7:
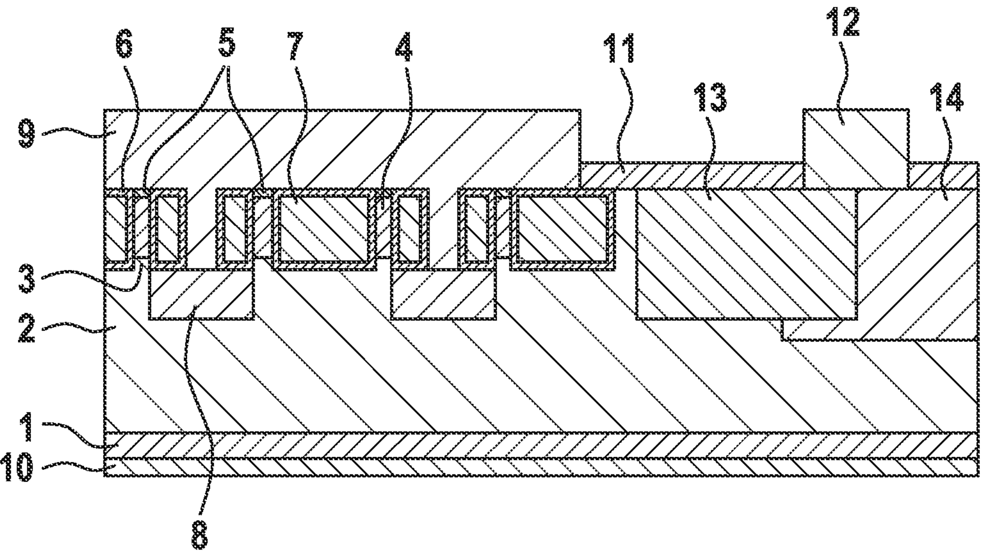
FIG. 7 shows a schematic representation of a conventional transistor arrangement.

FIG. 7 shows a schematic representation of a conventional power transistor with a fin structure using the example of a FinMOS transistor. A weakly n-doped epitaxy layer 2 has epitaxially grown on a highly n-doped semiconductor substrate 1. In the upper region of this epitaxy layer 2 is a region with a fin structure 3, which comprises a p-doped channel zone 4 as well as a strongly n-doped source zone 5. A gate dielectric 6 electrically separates the fins 3 and the source zone 5 from a gate electrode 7 introduced in a region between the fins 3. In the event of a lockout, the structure with the gate electrode 7 is protected from high electrical fields by p-doped shield implants 8 that have been introduced into the epitaxy layer 2 below the fins 3. On the top side, the fins 3 are electrically contacted by a source electrode 9. On the bottom side, the semiconductor substrate 1 is electrically contacted by a drain electrode 10. An edge region surrounding the region with the fin structure 3 can, for example, be shielded from electrical fields by a highly p-doped, further shield implant 13 as well as a low p-doped edge implant 14. These implants in the edge region are contacted by a corresponding electrode 12, wherein this electrode 12 is electrically connected to the source electrode 9. Between the electrodes 9 and 12, there is usually an electrical insulation 11.

In such a configuration, the shield implant 13 and the edge implant 14 must reach a depth similar to the depth of the shield implant 8 below the fin structure 3. This requires a very large implantation depth for the shield implant 13 and the edge implant 14, which is associated with a very high energy expenditure and thus very high costs.

Figure 1:
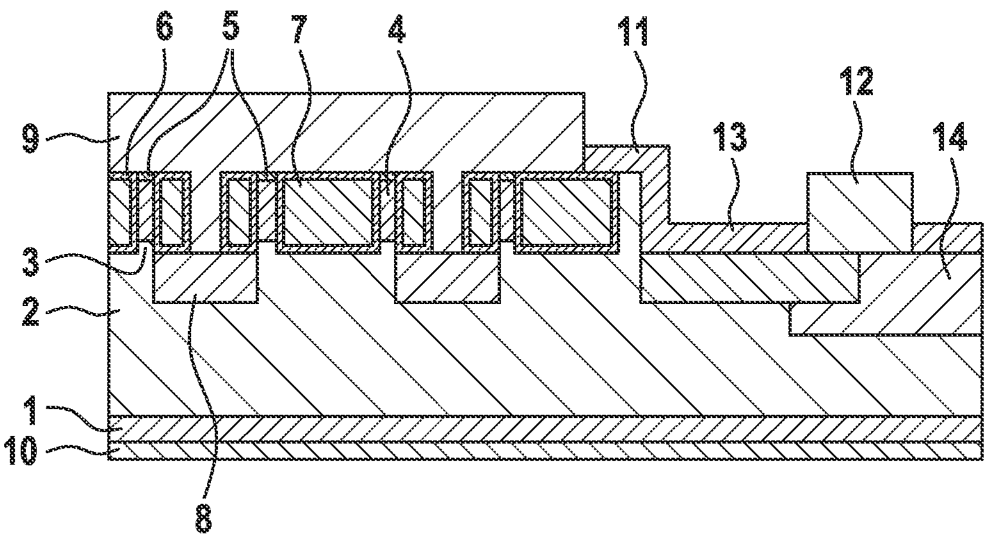
FIG. 1 shows a schematic representation of a transistor arrangement according to one example embodiment of the present invention.

FIG. 1 shows a schematic representation of a cross section through a transistor arrangement for a power transistor with a fin structure according to one embodiment of the present invention. The basic structure of the power transistor with semiconductor substrate 1, epitaxy layer 2, fin structure 3 and the further elements for gate, source and drain generally corresponds to the above-described structure according to FIG. 7. However, the structure according to the present invention differs from the above-described structure in particular in that the epitaxy layer 2 is lowered in the edge region around the fin structure. In other words, a thickness of the epitaxy layer 2 between a bottom side, which borders the semiconductor substrate 1, and an opposite top side, on which the fin structure 3 borders the electrode 9, is greater than the thickness in the edge region between the bottom side of the epitaxy layer and the top side, on which the epitaxy layer borders the electrode 12.

Due to the reduced thickness of the epitaxy layer 2 in the edge region, the shield implant 12 and optionally the edge implant 13 must thus respectively have a lower penetration depth in order to achieve the required shielding effect.

In the example embodiment shown in FIG. 1, the edge region of the transistor arrangement is lowered by the height of the fin structure 3. The shield implant 8 below the fin structure 3 and the shield implant 13 in the edge region can thus also have an identical implantation depth in each case in order to achieve the desired shielding effect. In comparison to a conventional transistor arrangement, the shielding effect can therefore be achieved with a significantly lower implantation depth for the shield implant 13 in the edge region. The optionally adjoining edge implant 14 in the edge region can also be adjusted accordingly so that an implantation effort that is reduced by the depth of the lowering in the edge region is also required here. In the embodiment shown here, the shield implant 13 and the edge implant 14 overlap in the edge region.

The lowering of the epitaxy layer in the edge region can be realized, for example, by a trench. In particular, the lowering in the edge region can optionally be created in the same process step as the production of the fin structure 3. An additional, separate process step of creating this trench in the edge region can thus be omitted.

Figure 2:
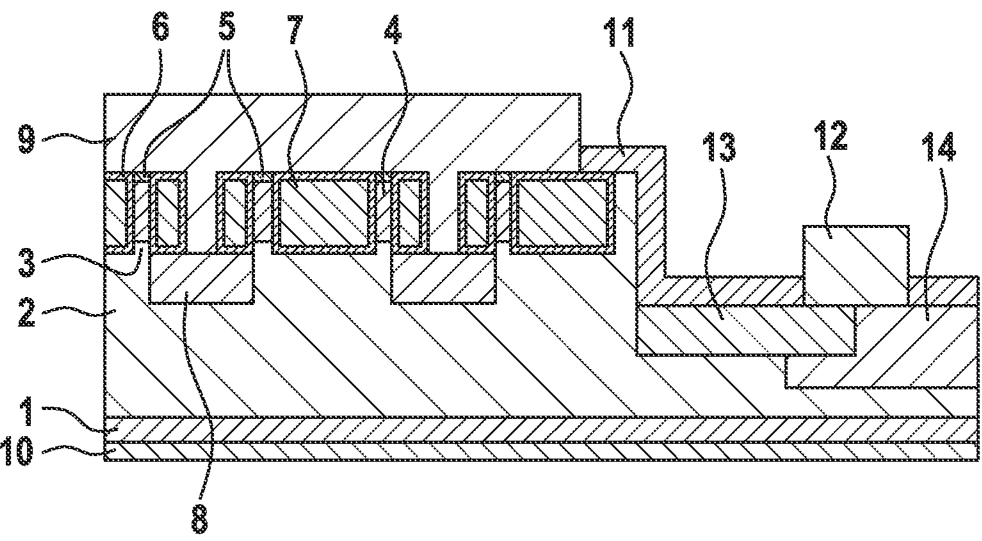
FIG. 2 shows a schematic representation of a transistor arrangement according to a further example embodiment of the present invention.

FIG. 2 shows a schematic representation of a transistor arrangement for a power transistor with fin structure according to a further embodiment of the present invention. The embodiment shown here differs from the above-described embodiment in particular in that the trench in the edge region is lowered deeper than the height of the fin structure 3. In such a case, it is also possible to implement the fin structure 3 and the lowering of the epitaxy layer 2 in the edge region in a common process step. Due to the greater depth of the trench in the edge region, the implants 13 and 14 can be deeper than the shield implant 8 below the fin structure 3. In this way, an improved shielding effect of the implants 13 and 14 in the edge region can be achieved, wherein a relatively low implantation energy is required for these implants. The lowering of the epitaxy layer 2 in the edge region can be implemented such that the trench in the edge region is deeper than the height of the fin structure 3, i.e., the trenches with which the fin structure 3 is realized.

Figure 3:
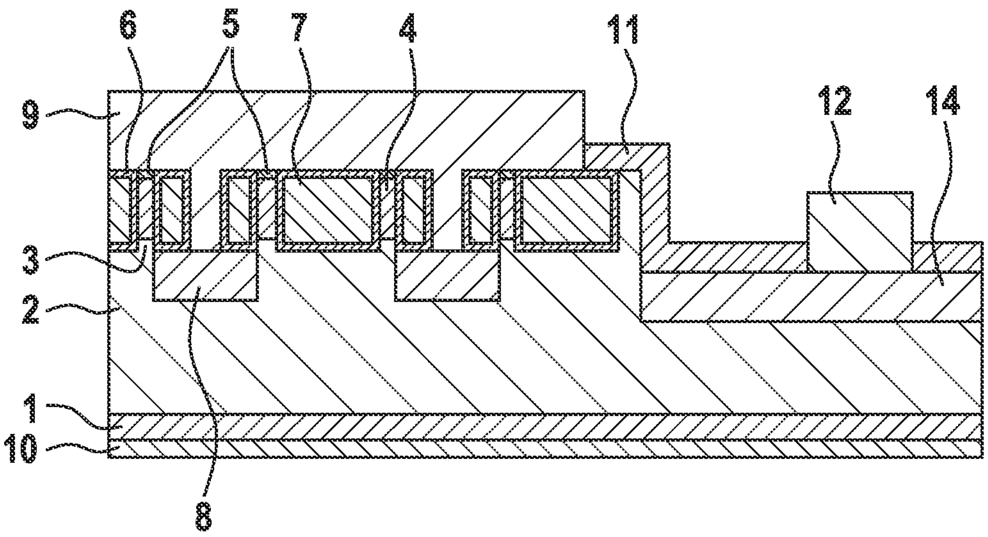
FIG. 3 shows a schematic representation of a transistor arrangement according to a further example embodiment of the present invention.

FIG. 3 shows a schematic representation of a transistor arrangement for a power transistor of the fin structure according to yet a further embodiment of the present invention. The embodiment according to FIG. 3 differs from the above-described embodiments in particular in that, in the edge region, only one edge implant 14 is provided throughout.

Figure 4:
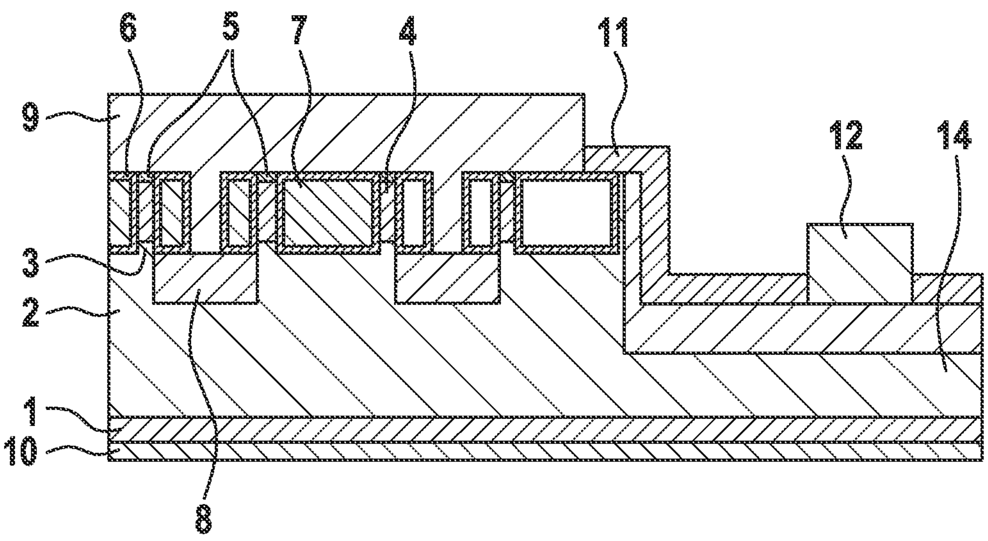
FIG. 4 shows a schematic representation of a transistor arrangement according to a further example embodiment of the present invention.

FIG. 4 shows a schematic representation of the transistor arrangement for power transistors of a fin structure according to a further embodiment of the present invention. This embodiment differs from the above-described embodiment according to FIG. 3 in particular in that the edge implant 14 is also implemented in a lateral edge region facing the fin structure 3.

Figure 5:
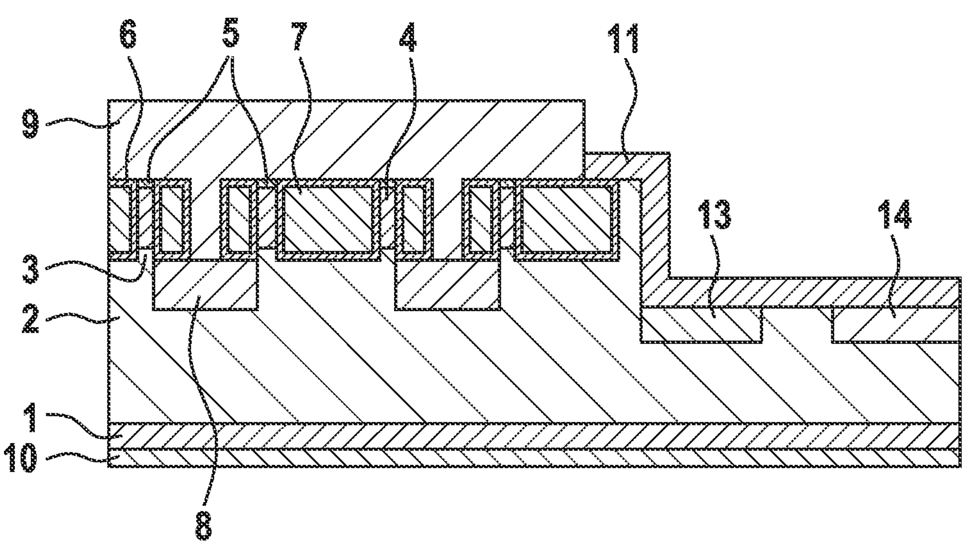
FIG. 5 shows a schematic representation of a transistor arrangement according to yet a further example embodiment of the present invention.

FIG. 5 shows a schematic representation of a transistor arrangement for power transistors of a fin structure according to yet a further embodiment of the present invention. This embodiment differs from the above-described embodiments in that both the shield implant 13 and the edge implant 14 do not have an electrical connection. Such a configuration is also referred to as "floating guard rings."

All above-described embodiments for transistor arrangements can be realized in both FinFET and FinMOS. Furthermore, the corresponding transistor arrangements can also be realized both with silicon carbide (SiC) and with gallium nitride (GaN) or other wide-gap materials. The n- and p-dopings described in connection with FIG. 1 can also be adjusted accordingly depending on the application in order to realize an n-channel or a p-channel transistor.

Figure 6:
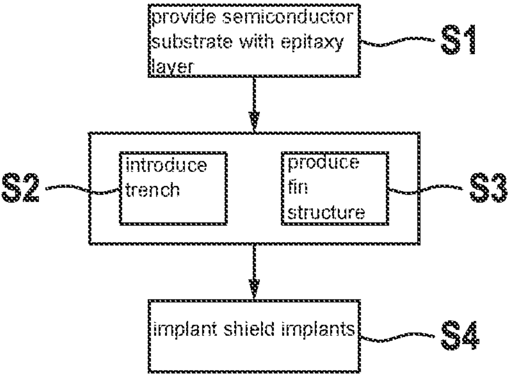
FIG. 6 shows a flowchart as underlying a method for producing a transistor arrangement according to one example embodiment of the present invention.

FIG. 6 shows a flowchart for a method for producing a transistor with a fin structure according to one embodiment of the present invention. The method can generally comprise any steps required to realize one of the above-described transistor arrangements for a power transistor of a fin structure. Analogously, the above-described transistor arrangements can also comprise any elements and structures as can be achieved in connection with the production method described below.

In a step S1, a semiconductor substrate 1 with an epitaxy layer 2 grown epitaxially on the semiconductor substrate is provided first. A first side of the epitaxy layer 2 faces the semiconductor substrate 1, and an opposite second side faces away from the semiconductor substrate 1.

In a step S2, a trench is introduced into the epitaxy layer 2 in the edge region in order to lower the epitaxy layer 2. Furthermore, in a step S3, optionally in the same process step as step S2, a fin structure 3 can be produced in the epitaxy layer 2.

Finally, in step S4, shield implants 8, 13 and optionally an edge implant 14 are implanted in the epitaxy layer.

In summary, the present invention relates to a transistor arrangement for power transistors with a fin structure. It is in this case provided to lower the epitaxy layer of the transistor arrangements in an edge region surrounding the fin structure and to introduce shield implants and edge implants into the epitaxy layer after lowering.

The invention claimed is:

1. A transistor arrangement, comprising:
a semiconductor substrate; and
an epitaxy layer applied onto the semiconductor substrate, with a first side facing the semiconductor substrate and a second side opposite the first side, wherein the epitaxy layer includes a region with a fin structure, and an edge region surrounding the region with the fin structure, and wherein a thickness between the first side and the second side of the epitaxy layer in the region with the fin structure is greater than a thickness between the first side and the second side of the epitaxy layer in the edge region;
wherein the epitaxy layer includes a first shield implant arranged below the region with the fin structure, wherein the epitaxy layer includes a further shield implant arranged in the edge region, and wherein a lower end of the further shield implant facing the first side of the epitaxy layer projects at least as deep into the epitaxy layer as a lower end of the first shield implant facing the first side of the epitaxy layer.

2. The transistor arrangement according to claim 1, wherein the thickness of the epitaxy layer in the region with the fin structure is greater, at least by a thickness of the fin structure, than the thickness of the epitaxy layer in the edge region.

3. The transistor arrangement according to claim 1, wherein the thickness of the epitaxy layer in the region with the fin structure is greater than the thickness of the epitaxy layer in the edge region by more than a thickness of the fin structure.

4. The transistor arrangement according to claim 1, wherein the first shield implant and the further shield implant project at least approximately equally far into the epitaxy layer.

5. The transistor arrangement according to claim 1, wherein the epitaxy layer further includes an edge implant which is more weakly doped than the further shield implant and is arranged in the edge region.

6. A transistor arrangement, comprising:
a semiconductor substrate; and
an epitaxy layer applied onto the semiconductor substrate, with a first side facing the semiconductor substrate and a second side opposite the first side, wherein the epitaxy layer includes a region with a fin structure, and an edge region surrounding the region with the fin structure, and wherein a thickness between the first side and the second side of the epitaxy layer in the region with the fin structure is greater than a thickness between the first side and the second side of the epitaxy layer in the edge region;
wherein first electrical contacting is provided on the second side of the epitaxy layer in the region of the fin structure, and second electrical contacting, which is electrically connected to the first electrical contacting, is provided in the edge region.

7. A power transistor, comprising:
a transistor arrangement including:
a semiconductor substrate; and
an epitaxy layer applied onto the semiconductor substrate, with a first side facing the semiconductor substrate and a second side opposite the first side, wherein the epitaxy layer includes a region with a fin structure, and an edge region surrounding the region with the fin structure, and wherein a thickness between the first side and the second side of the epitaxy layer in the region with the fin structure is greater than a thickness between the first side and the second side of the epitaxy layer in the edge region;
wherein the epitaxy layer includes a first shield implant arranged below the region with the fin structure, wherein the epitaxy layer includes a further shield implant arranged in the edge region, and wherein a lower end of the further shield implant facing the first side of the epitaxy layer projects at least as deep into the epitaxy layer as a lower end of the first shield implant facing the first side of the epitaxy layer.

8. The power transistor of claim 7, wherein the power transistor is a field-effect transistor (FET) or metal-oxide (MOS) transistor with a fin structure.

9. A method for producing a transistor with a fin structure, comprising the following steps:

providing a semiconductor substrate including an epitaxy layer applied onto the semiconductor substrate, wherein the epitaxy layer has a first side facing the semiconductor substrate and a second side opposite the first side;

introducing a trench in an edge region surrounding a region for the fin structure of the transistor;

producing the fin structure in the epitaxy layer; and producing first shield implants in a region of the epitaxy layer, for the fin structure of the transistor, and a further shield implant in the edge region of the epitaxy layer.

* * * * *